(12) United States Patent
Kojima et al.

(10) Patent No.: US 6,384,517 B1
(45) Date of Patent: May 7, 2002

(54) MULTILAYER PIEZOELECTRIC DEVICE AND METHOD OF PRODUCING SAME

(75) Inventors: Tatsuya Kojima; Kenji Horino, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/671,351

(22) Filed: Sep. 27, 2000

(30) Foreign Application Priority Data

Sep. 30, 1999 (JP) .......................................... 11-280016
Jun. 26, 2000 (JP) ........................................ 2000-190654

(51) Int. Cl.[7] .............................................. H03H 41/08
(52) U.S. Cl. ..................................... 310/358; 310/366
(58) Field of Search ................................ 310/358, 366, 310/356, 363; 252/62

(56) References Cited

U.S. PATENT DOCUMENTS 4,988,909 A * 1/1991 Hagimura .................. 310/358
5,645,753 A * 7/1997 Fukuoka ..................... 252/62.9
6,140,746 A * 10/2000 Miyashita ................... 310/358

FOREIGN PATENT DOCUMENTS

| JP | A-5-110157 | 4/1993 |
| JP | A-9-261978 | 10/1997 |

* cited by examiner

Primary Examiner—Nestor Ramirez
Assistant Examiner—Karen B Addison
(74) Attorney, Agent, or Firm—Oliff & Berridge, PLC

(57) ABSTRACT

A multilayer piezoelectric device comprised of piezoelectric layers and internal electrode layers alternately stacked, wherein the internal electrode layers have a thickness of 1 to 3 μm and contain 20 to 90 wt % of gold as an essential ingredient, based on 100 wt % of the metal ingredients in the internal electrode layers, and at least one element selected from palladium, platinum, and rhodium.

17 Claims, 1 Drawing Sheet

MULTILAYER PIEZOELECTRIC DEVICE AND METHOD OF PRODUCING SAME

BACKGROUND OF THE INVENTION

1. Field of the Invention

The present invention relates to a multilayer piezoelectric actuator device or another multilayer piezoelectric device and a method of producing the same, more particularly relates to a multilayer piezoelectric device and method of producing the same superior in moisture resistance.

2. Description of the Related Art

In recent years, along with the increasing precision of machine tools, industrial machines, measurement machines, and other precision machinery, there has been a strong demand for establishment of super-precision positioning technology offering a high reliability of operation and enabling high speed operation. Further, progress in micromachines has led to a strong demand for development of microactuators.

In the past, various microactuators have been known. For the following reasons, however, a multilayer piezoelectric actuator device has been viewed as promising as a multilayer piezoelectric viewed as promising as a multilayer piezoelectric device. That is, a multilayer piezoelectric actuator device is small in size, enables microdisplacement precision control, offers a fast response speed, generates a large force, and is high in energy conversion efficiency.

In general, a multilayer piezoelectric actuator comprises a plurality of piezoelectric layers and internal electrode layers alternately stacked.

In the past, the internal electrode layers in multilayer piezoelectric actuator devices, as shown in Japanese Unexamined Patent Publication (Kokai) No. 9-261978, have been generally comprised of inexpensive silver or a silver and palladium alloy.

Such a conventional multilayer actuator device, however, suffers from a tendency of the insulating property of the piezoelectric layers to fall under a high humidity environment and therefore has a problem in durability. This is believed to be because migration of the silver in the electrodes (ionization of silver and movement between electrodes) occurs under a highly humid environment. Depending on the application of the multilayer piezoelectric actuator device etc., sometimes the ends of the internal electrodes have to be exposed from the end faces of the device. In such a device, moisture resistance is particularly required.

Further, Japanese Patent No. 2826078 discloses a multilayer actuator device having internal electrode layers comprised of platinum, palladium, rhodium, silver-palladium, silver-platinum, and platinum-palladium. As shown in this publication, however, when using silver-palladium, silver-platinum, or another metal mainly comprised of silver as the internal electrode layers, the silver in the electrodes is liable to undesirably migrate in a highly humid environment due to the above reasons. Further, as shown in this publication, when using platinum, palladium, or rhodium alone or alloys of the same as the internal electrode layers, there is little shrinkage of the electrode layers compared with shrinkage of the piezoelectric layers due to sintering in the process of production of the device, so that the piezoelectric layers and internal electrode layers peel apart during firing, that is, delamination occurs. Due to this delamination, the reliability of the device against moisture deteriorates.

SUMMARY OF THE INVENTION

An object of the present invention is to provide a multilayer piezoelectric actuator device or other multilayer piezoelectric device free from deterioration of the insulation resistance of the piezoelectric layers, superior in moisture resistance, and having a high reliability and a method of producing the same.

To achieve the above object, the multilayer piezoelectric device according to the present invention comprises piezoelectric layers and internal electrode layers alternately stacked, the internal electrode layers containing gold as an essential ingredient.

Further, according to the inventor, the method of producing a multilayer piezoelectric device comprised of piezoelectric layers and internal electrode layers alternately stacked, comprises the steps of including gold in the internal electrode layers as an essential ingredient and firing the piezoelectric layers and internal electrode layers at a temperature of 1020 to 1220° C., more preferably 1060 to 1200° C.

Preferably, the content of the gold in the internal electrode layers is 20 to 90 wt %, more preferably 60 to 90 wt %, particularly preferably 60 to 80 wt %, with respect to the total weight of the metal ingredients in the internal electrode layers as 100 wt %.

Preferably the internal electrode layers contain gold as an essential ingredient and preferably contain at least one element from palladium, platinum, and rhodium, more preferably at least one element from palladium and platinum, particularly preferably palladium. The total content of the palladium, platinum, and rhodium in the internal electrode layers is paticularly preferably 10 to 80 wt %, more preferably 10 to 40 wt %, preferably 20 to 40 wt % with respect to the total weight of the metal ingredients in the internal electrode layers as 100 wt %. Particularly, the content of the palladium is preferably 20 to 40 wt %, more preferably 25 to 35 wt %.

Preferably, the thickness of the internal electrode layers is 1 to 3 $\mu$m.

Preferably, the area of the piezoelectric layers which the internal electrode layers actually cover, that is, the coverage rate, is 50 to 99 percent, more preferably 70 to 90 percent. Note that the "coverage rate" means the rate obtained by assuming a virtual predetermined area on the surface of an internal electrode layer, defining that predetermined area as 100 percent, and expressing the area of a piezoelectric layer which the internal electrode layer actually covers, that is, the coverage, as a percent.

If no holes etc. are formed in the internal electrode layer, the coverage rate is 100 percent.

Preferably, each piezoelectric layer comprises a lead-based piezoelectric material.

Preferably, the lead-based piezoelectric material contains a composition of the formula:

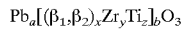

where $\beta_1$ is at least one element selected from Zn, Cd, Mg, Ni, Co, Fe, Sc, Cr, Yb, Lu, In, Mn, and Sn and $\beta_2$ is at least one element selected from Nb, Ta, W, Te, and Sb and x, y, z, a, and b are in relations of $0<x<0.5$,
$0.1 \leq y \leq 0.55$,
$0.2 \leq z \leq 0.60$,
$x+y+z=1$, and
$0.97 \leq a/b \leq 1$.

Alternatively, the lead-based piezoelectric material contains a composition of the formula:

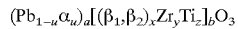

where $\alpha$ is at least one element selected from Sr, Ba, Ca, and La, $\beta_1$ is at least one element selected from Zn, Cd, Mg, Ni, Co, Fe, Sc, Cr, Yb, Lu, In, Mn, and Sn, and $\beta_2$ is at least one element selected from Nb, Ta, W, Te, and Sb and x, y, z, a, b, and u are in relations of
$0<x<0.5$,
$0.1 \leq y \leq 0.55$,
$0.2 \leq z \leq 0.60$,
$x+y+z=1$,
$0.97 \leq a/b \leq 1$, and
$0<u \leq 0.15$.

When using platinum, palladium, or rhodium alone or alloys of the same as the internal electrode layers, there is little shrinkage of the electrode layers compared with shrinkage of the piezoelectric layers due to sintering in the process of production of the device, so that the piezoelectric layers and internal electrode layers peel apart, that is, delamination occurs. Due to this delamination, the reliability of the device against moisture deteriorates. It has been considered to mix a low melting point metal and high melting point metal together to make the shrinkage behavior similar to that of the piezoelectric layers and thereby make delamination difficult. As the low melting point metal, silver or copper may be considered. In an internal electrode layer containing these metals, however, migration easily occurs under a high humidity environment.

In the multilayer piezoelectric device and method of producing the same according to the present invention, by designating gold as an essential ingredient and including palladium, platinum, and/or rhodium in the internal electrode layers, the adhesion with the piezoelectric layers can be maintained well and the moisture resistance can be improved.

In the present invention, if the thickness of the internal electrode layers is too small, the internal electrode layers tend to easily become discontinuous, while if the thickness is too large, delamination tends to easily occur due to the difference of shrinkage between the piezoelectric layers and internal electrode layers at the time of sintering. Further, if the thickness of the internal electrode layers is too large, in the case of an actuator device, displacement of the piezoelectric layers tends to be hampered, so the material is wasted. This leads to an increase in the manufacturing costs.

After firing, the internal electrode layer sometimes is formed with fine holes such as holes through which the solvent in the metal paste for forming the internal electrode layers escapes. Due to these fine holes etc., the area of a piezoelectric layer which an internal electrode layer actually covers, that is, the coverage, sometimes becomes smaller than the total area scheduled to be covered. As the internal electrode layers are fired, the fine holes combine to form large holes and the coverage falls. Further, the internal electrode layers also shrink due to exposure to high temperatures. Holes are made larger due to this.

In the present invention, by controlling the area of the piezoelectric layers which the internal electrode layers actually covers, that is, the coverage (coverage rate), to 50 to 99 percent, preferably 70 to 90 percent, sufficient displacement of the actuator device can be obtained and delamination can be suppressed. If the coverage rate is too small, sufficient displacement of the actuator device tends to be unobtainable, while if the coverage rate is too large, delamination tends to easily occur.

In the present invention, the material of the piezoelectric layers is not particularly limited, but is preferably comprised of a lead-based piezoelectric material of a firing temperature of a relatively low temperature of 1000 to 1250° C. By configuring the invention in this way, the behavior of the piezoelectric layers at the time of firing becomes similar to the behavior of the internal electrode layers containing gold as an essential ingredient at the time of firing and the occurrence of delamination etc. can be suppressed.

In the present invention, the firing temperature is preferably 1020 to 1220° C., more preferably 1060 to 1200° C. If the firing temperature is too low, the sintering tends to become insufficient, while if too high, discontinuation of the electrodes tends to easily occur and the moisture resistance tends to fall.

The present invention can be applied to all multilayer piezoelectric devices comprised of piezoelectric layers and internal electrode layers alternately stacked, but the effect is particularly great when applied to a multilayer piezoelectric actuator device. Further, the effect is particularly large when the present invention is applied to a multilayer piezoelectric device where parts of the internal electrode layers are exposed at the surface of the device. In these cases, the moisture resistance has to be particularly superior.

DESCRIPTION OF THE PREFERRED EMBODIMENTS

Figure 1:
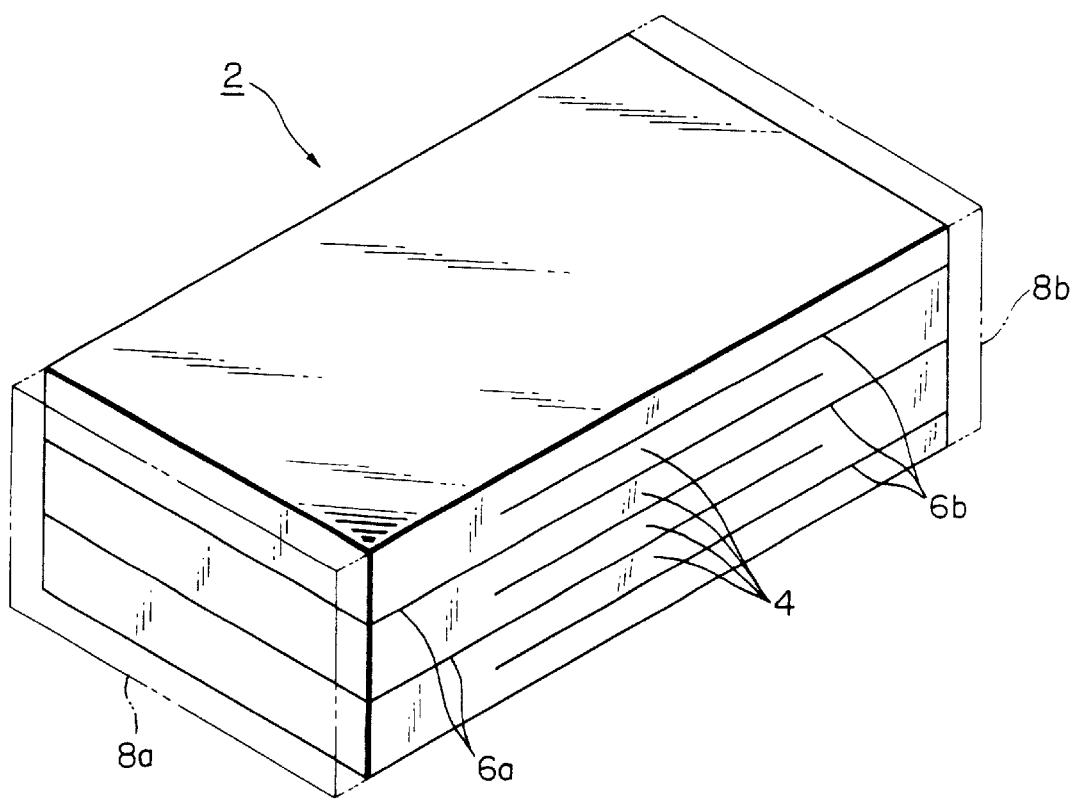
FIG. 1 is a perspective view of a multilayer piezoelectric actuator device according to an embodiment of the present invention.

Next, the present invention will be explained based on the embodiment shown in the figures.

FIG. 1 is a perspective view of a multilayer piezoelectric actuator device according to an embodiment of the present invention.

As shown in FIG. 1, the multilayer piezoelectric actuator device 2 according to the present embodiment is one used as an actuator for positioning for example an ink jet printer head or hard disc drive head. The actuator device 2 is comprised of piezoelectric layers 4 and internal electrode layers 6a, 6b alternately stacked.

The internal electrode layers 6a are connected to an external electrode 8a provided at one end of the device 2. The other internal electrode layers 6b are connected to an external electrode 8b provided at the other end of the device 2. The sides of the internal electrode layers 6a and 6b are exposed from the side faces of the device 2.

By supplying a DC voltage or AC voltage to the external electrodes 8a and 8b, voltage is supplied to the piezoelectric layers 4 positioned between the internal electrode layers 6a and 6b, the electrical energy is converted to mechanical energy, and the device 2 displaces or vibrates in either the horizontal or vertical direction with respect to the electrode forming faces.

In the present embodiment, the internal electrode layers 6a and 6b contain gold as an essential ingredient and contain at least one element from palladium, platinum, and rhodium, preferably at least one element from palladium and platinum, particularly preferably palladium. Preferably, the content of the gold in the internal electrode layers 6a and 6b is 20 to 90 wt %, more preferably 60 to 90 wt %, particularly preferably 60 to 80 wt %, with respect to the total weight of the metal ingredients in the internal electrode layers 6a and 6b as 100 wt %.

The piezoelectric layers 4 are not particularly limited, but in the present embodiment preferably are comprised of a lead-based piezoelectric material similar in shrinkage behavior to the internal electrode layers 6a and 6b containing gold.

Preferably, the lead-based piezoelectric material contains a composition of the formula:

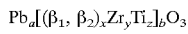
$$Pb_a[(\beta_1, \beta_2)_x Zr_y Ti_z]_b O_3$$

where $\beta_1$ is at least one element selected from Zn, Cd, Mg, Ni, Co, Fe, Sc, Cr, Yb, Lu, In, Mn, and Sn and $\beta_2$ is at least one element selected from Nb, Ta, W, Te, and Sb and x, y, z, a, and b are in relations of
$0<x<0.5$,
$0.1 \leq y \leq 0.55$,
$0.2 \leq z \leq 0.60$,
x+y+z=1, and
$0.97 \leq a/b \leq 1$.

Alternatively, the lead-based piezoelectric material contains a composition of the formula:

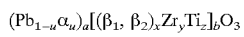
$$(Pb_{1-u}\alpha_u)_a[(\beta_1, \beta_2)_x Zr_y Ti_z]_b O_3$$

where $\alpha$ is at least one element selected from Sr, Ba, Ca, and La, $\beta_1$ is at least one element selected from Zn, Cd, Mg, Ni, Co, Fe, Sc, Cr, Yb, Lu, In, Mn, and Sn, and $\beta_2$ is at least one element selected from Nb, Ta, W, Te, and Sb and x, y, z, a, b, and u are in relations of
$0<x<0.5$,
$0.1 \leq y \leq 0.55$,
$0.2 \leq z \leq 0.60$,
x+y+z=1,
$0.97 \leq a/b \leq 1$, and
$0 < u \leq 0.15$.

With an "x" in the above formula of 0, the piezoelectric characteristic is low and the strength also tends to become smaller, so this is not preferred. If "x" is 0.5 or more, a pervoskite phase and also a pyrochlore phase are observed and the piezoelectric characteristic tends to become low, so this is also not preferred much. Further, if "y" is smaller than 0.1, the piezoelectric characteristic tends to become low, so this is not preferred. If "y" is over 0.55, the piezoelectric characteristic similarly tends to become low, so this is also not preferred much. Further, if z is smaller than 0.2 or if z is more than 0.60, the piezoelectric characteristic tends to become low, so these are not preferred.

Further, if the ratio (a/b) of "a" and "b" in the above formula is smaller than 0.97, the piezoelectric characteristic tends to become low, so this is not preferred, while if a/b is more than 1, the piezoelectric characteristic tends to become low and the strength smaller. Further, when "u" is 0, the piezoelectric characteristic tends to become low, so this is not preferred much, while if "u" is over 0.15, the piezoelectric characteristic tends to become low and the strength smaller, so these are not preferred much.

In the present embodiment, the thicknesses of the internal electrode layers 6a and 6b and the piezoelectric layers 4 are not particularly limited, but the thickness of the internal electrode layers 6a and 6b is preferably 1 to 3 μm and the thickness of the piezoelectric layers 4 is preferably 5 to 50 μm.

Next, an explanation will be made of a method of producing a multilayer piezoelectric actuator device 2 shown in FIG. 1.

First, a piezoelectric layer paste and internal electrode layer paste are prepared. The piezoelectric layer paste may be an organic-based coating comprised of a mixture of a piezoelectric material and an organic vehicle or a water-based coating.

As the starting materials of the piezoelectric material, oxides for comprising the piezoelectric material of the above composition or mixtures or compound oxides of the same may be used, but it is also possible to suitably select and mix various oxides changing to the piezoelectric material of the above composition after firing, for example, carbonates, oxalates, nitrates, hydroxides, organic metal compounds, etc. The contents of the compounds in the starting materials may be suitably determined so as to give the composition of the above piezoelectric composition after firing.

The starting materials are usually used as powders of an average particle size of 1.0 to 5.0 μm or so. The starting materials are wet-mixed by a ball mill etc., then calcined. The calcination is preferably performed at a temperature of 800 to 1100° C. for about 1 to 3 hours. This calcination may be performed in the atmosphere or may be performed in an atmosphere of a higher partial pressure of oxygen than the atmosphere or a pure oxygen atmosphere.

The thus obtained calcined material is next wet-pulverized using a ball mill etc. At this time, as the slurry solvent, preferably ethanol or another alcohol or a mixed solvent of water and ethanol is preferably used. The wet pulverization is preferably performed so as to give an average particle size of the calcined material of 0.5 to 2.0 μm.

A powder obtained by calcination and then wet pulverization is used as a piezoelectric material and that piezoelectric material is dispersed in an organic vehicle. The "organic vehicle" is comprised of a binder dissolved in an organic solvent. The binder used for the organic vehicle is not particularly limited and may be suitably selected from various types of ordinary binders such as ethyl cellulose and polyvinyl butyral. Further, the organic solvent used is not particularly limited and may be suitably selected, in accordance with the printing method, sheet method, or other method used, from various types of organic solvents such as terpineol, butyl carbitol, acetone, and toluene.

Further, when making the piezoelectric layer paste a water-based coating, a water-based vehicle comprised of a water-soluble binder or dispersant etc. dissolved in water and the piezoelectric material may be mixed. The water-soluble binder used in the water-based vehicle is not particularly limited, but for example polyvinyl alcohol, cellulose, a water-soluble acryl resin, etc. may be used.

The internal electrode layer paste is prepared by mixing a conductive material comprised of various metals or alloys or various types of oxides, organic metal compounds, resinates, etc. changing into the above conductive materials after firing with the above organic vehicle.

The content of the organic vehicle in the pastes is not particularly limited, but the usual content is for example made 1 to 5 wt % of a binder and 10 to 50 wt % of a solvent, for example. Further, the pastes may contain in accordance with need additives selected from various types of dispersants, plasticizers, piezoelectrics, insulators, etc. The total content of these is preferably made not more than 10 wt %.

When using the printing method, the piezoelectric layer paste and internal electrode layer paste are printed in layers on a PET or other substrate. The substrate is cut into a predetermined shape, then the paste lamination is peeled off from the substrate to obtain a green chip.

Further, when using the sheet method, the piezoelectric layer paste is used to form green sheets, an internal electrode layer paste is printed on them, then these are stacked to form a green chip.

Before firing, the green chip is treated to remove the binder. The treatment to remove the binder may be performed under ordinary conditions, but is preferably performed at a temperature of 300 to 700° C. in an atmosphere of a partial pressure of oxygen higher than the atmosphere or a pure oxygen atmosphere.

After the treatment to remove the binder, the chip is fired at a temperature of 1000 to 1250° C., preferably 1020 to 1220° C., for 0.5 to 5 hours. The chip may be fired in the atmosphere or may be fired in an atmosphere of a partial pressure of oxygen higher than the atmosphere or a pure oxygen atmosphere.

The fired internal electrode layers 6a and 6b are sometimes formed with fine holes such as holes formed by the escape of the solvent in the metal paste for forming the internal electrode layers 6a and 6b. Due to these fine holes etc., the area of the piezoelectric layers 4 which the internal electrode layers 6a and 6b actually cover, that is, the coverage, sometimes becomes smaller than the total area scheduled to be covered. In the present embodiment, the area of the piezoelectric layers 4 which the internal electrode layers 6a and 6b actually cover, that is, the coverage (coverage rate), is controlled to about 50 to 99 percent. Specifically, the coverage rate is controlled by the firing temperature and the type and added amounts of the metal species in the paste, the various types of oxides (including co-materials), the organic metal compounds, and the resinates, etc.

By controlling the coverage rate to within this range, it is possible to obtain a sufficient displacement as an actuator device and possible to suppress delamination. If the coverage rate is too small, a sufficient displacement cannot be obtained as an actuator device 2, while if the coverage rate is too large, delamination tends to easily occur.

Note that the present invention is not limited to the above embodiments and may be modified in various ways within the scope of the present invention.

Next, the present invention will be explained based on detailed examples, but the present invention is not limited to these examples.

EXAMPLE 1

As the final composition of the piezoelectric layers, predetermined amounts of PbO, $TiO_2$, $ZrO_2$, CoO, $Nb_2O_5$, $SrCO_3$, and $WO_3$ were weighted as the starting materials so as to give a lead-based piezoelectric material comprised of 99.4 wt % of $(Pb_{0.957}Sr_{0.04})((Co_{1/3}Nb_{2/3})_{0.01}Ti_{0.458}Zr_{0.532})O_3$ and 0.6 wt % of $WO_3$. Next, these starting materials were wet-mixed using a ball mill for 5 hours, then calcined at 900° C. for 2 hours. Next, the result was pulverized using a ball mill for 15 hours to make a piezoelectric material. The piezoelectric material was made to disperse in an organic vehicle to make a piezoelectric layer paste and the result was formed into a sheet by the doctor blade method to thereby obtain a piezoelectric green sheet. As the binder in the organic vehicle, use was made of 48 wt % of an acryl resin based on 100 wt % of the piezoelectric composition. Further, as the organic solvent in the organic vehicle, use was made of 40 wt % of methylene chloride, 20 wt % of ethyl acetate, and 4 wt % of acetone based on 100 wt % of the piezoelectric composition. Further, the thickness of the sheet was 20 $\mu$m.

The internal electrode layer paste was prepared by dispersing in an organic vehicle a metal species alone or an alloy thereof or an organic metal compound or resinate etc. shown in the following Table 1 and kneading it by a triple-roll mill. As the binder in the organic vehicle, ethyl cellulose was used. Further, as the organic solvent in the organic vehicle, terpineol was used.

The internal electrode layer paste was coated on piezoelectric green sheets by the screen printing method. These were stacked, then compressed, then cut into a predetermined size to obtain a green chip. The coating thickness of the internal electrodel layer paste was 4.2 $\mu$m. The number of piezoelectric green sheets coated with the internal electrodel layer paste which were stacked was nine.

Next, the green chip was treated at 350° C. for 3 hours to remove the binder, then was fired at 1060° C. for 2 hours to obtain a multilayer piezoelectric actuator device body. Next, the device was polished at its end faces by sand blasting to expose the side ends of the internal electrodes, then a metal paste was printed on them as an external electrode paste. The result was baked at 700° C. to obtain a sample for a moisture resistance test. The size of the sample according to this Example 1 was 3.2×1.6×0.6 mm, the thickness of the internal electrode layers was 1.8 $\mu$m, and the thickness of the piezoelectric layers was 15 $\mu$m. Further, the weight ratio of the metals countained in the internal electrode was Au:Pt:Pd=7:3:0. Further, the coverage rate of the internal electrode layers was measured and found to be 70 percent. The coverage rate was found by taking an SEM photograph of an electrode portion of a range of 50 $\mu$m×50 $\mu$m and processing the image to find the area actually covered by the electrodes as compared with the total area and expressing this by a percent.

The sample according to Example 1 was tested for the insulation resistance (IR) reliability by supplying the sample with a DC voltage of 2 kV/mm under a high temperature, high humidity environment of 85° C. and 85% RH. The time until the IR falls by a double-digit amount compared with the initial value is made the lifetime of the sample. The IR was measured for up to 150 hours. A sample for which the IR failed to fall by double digits even after 150 hours was judged to be good. Twenty samples were tested. The ratio of good samples was expressed as a percentage. That rate was made the moisture resistance test survival rate. The results are shown in Table 1. As shown in Table 1, in Example 1, the moisture resistance test survival rate was 70 percent. Since the survival rate was more than 60 percent, the overall judgement was "good". Note that in the overall judgement, a survival rate of 90 percent or more is judged as "very good", one of 60 percent or more as "good", and others as "poor".

TABLE 1

| No. | Metal species | Ratio (wt %) | Thickness of electrode layer (μm) | Coverage rate (%) | Composition of material | Firing temperature (° C.) | Moisture resistance test survival rate (%) | Judgement | Remarks |
|---|---|---|---|---|---|---|---|---|---|
| Ex. 1 | Au:Pt:Pd | 7:3:0 | 1.8 | 70 | A | 1060 | 70 | Good | Delamination |
| Ex. 2 | Au:Pt:Pd | 3:7:0 | 1.8 | 75 | A | 1100 | 60 | Good | |
| Ex. 3 | Au:Pt:Pd | 2:8:0 | 1.8 | 85 | A | 1100 | 60 | Good | |
| Comp. Ex. 1 | Au:Pt:Pd | 0:10:0* | 1.8 | *100 | A | 1140 | 10 | Poor | |
| Comp. Ex. 2 | Ag:Pd* | 7:3 | 2 | 70 | A | 1060 | 2 | Poor | |
| Ex. 4 | Au:Pt:Pd | 7:3:0 | 1.8 | 70 | B | 1060 | 100 | V. Good | Delamination |
| Ex. 5 | Au:Pt:Pd | 7:1.5:1.5 | 1.8 | 85 | B | 1100 | 100 | V. Good | |
| Ex. 6 | Au:Pt:Pd | 7:0:3 | 1.9 | 90 | B | 1100 | 100 | V. Good | |
| Ex. 7 | Au:Pt:Pd | 3:7:0 | 1.9 | 80 | B | 1100 | 80 | Good | |
| Ex. 8 | Au:Pt:Pd | 3:5:2 | 2.0 | 90 | B | 1100 | 80 | Good | |
| Ex. 9 | Au:Pt:Pd | 3:4:3 | 2.0 | 90 | B | 1100 | 80 | Good | |
| Ex. 10 | Au:Pt:Pd | 2:8:0 | 1.8 | 85 | B | 1100 | 80 | Good | |
| Ex. 11 | Au:Pt:Pd | 2:7:1 | 1.9 | 85 | B | 1100 | 80 | Good | |
| Ex. 12 | Au:Pt:Pd | 2:6:2 | 1.8 | 90 | B | 1100 | 80 | Good | |
| Comp. Ex. 3 | Au:Pt:Pd | 0:10:0* | 2.0 | *100 | B | 1140 | 20 | Poor | |
| Comp. Ex. 4 | Ag:Pd* | 7:3 | 2.0 | 70 | B | 1060 | 10 | Poor | |
| Comp. Ex. 5 | Ag:Pd* | 3:7 | 2.1 | 80 | B | 1100 | 10 | Poor | |
| Ref. Ex. 1 | Au:Pt:Pd | 7:3:0 | *0.8 | *30 | B | 1060 | 30 | Poor | Discont. *1 |
| Ex. 13 | Au:Pt:Pd | 7:3:0 | 1.3 | 60 | B | 1060 | 80 | Good | |
| Ex. 14 | Au:Pt:Pd | 7:3:0 | 2.8 | 65 | B | 1060 | 70 | Good | |
| Ref. Ex. 2 | Au:Pt:Pd | 7:3:0 | *3.5 | 60 | B | 1060 | 20 | Poor | Delamination |
| Ref. Ex. 3 | Au:Pt:Pd | 7:3:0 | 1.8 | *40 | B | 1180 | 30 | Poor | |
| Ex. 15 | Au:Pt:Pd | 3:7:0 | 1.9 | 80 | C | 1180 | 70 | Good | |
| Ex. 16 | Au:Pt:Pd | 2:8:0 | 1.8 | 85 | C | 1180 | 70 | Good | |
| Ex. 17 | Au:Pt:Pd | 8:2:0 | 1.9 | 60 | B | 1020 | 80 | Good | |
| Ex. 18 | Au:Rh | 7:3 | 2.0 | 80 | B | 1100 | 80 | Good | |

Composition of materials
A: $(Pb_{0.957}Sr_{0.04})((Co_{1/3}Nb_{2/3})_{0.01}Ti_{0.458}Zr_{0.532})O_3$, $WO_3 = 0.6$ wt %
B: $(Pb_{0.95}Sr_{0.04})((Zn_{1/3}Nb_{2/3})_{0.1}Ti_{0.42}Zr_{0.48})O_3$, $Ta_2O_5 = 0.4$ wt %
C: $(Pb_{0.94}Sr_{0.04})((Mg_{1/3}Nb_{2/3})_{0.265}Ti_{0.395}Zr_{0.335})O_3$
*1: State where even initial capacity cannot be obtained since there is severe electrode discontinuation and electrodes are not connected.
*: Shows values outside preferable range of present invention.

EXAMPLE 2

The same procedure was followed as in Example 1 to find the coverage rate and the moisture resistance test survival rate except for making the weight ratio of the metal species in the internal electrode layers finally obtained Au:Pt:Pd= 3:7:0 and making the firing temperature 1100° C. The results are shown in Table 1. As shown in Table 1, the coverage rate was 75 percent and the survival rate was 60 percent. Since the survival rate was at least 60 percent, the overall judgement was "good".

EXAMPLE 3

The same procedure was followed as in Example 1 to find the coverage rate and the moisture resistance test survival rate except for making the weight ratio of the metal species in the internal electrode layers finally obtained Au:Pt:Pd= 2:8:0 and making the firing temperature 1100° C. The results are shown in Table 1. As shown in Table 1, the coverage rate was 85 percent and the survival rate was 60 percent. Since the survival rate was at least 60 percent, the overall judgement was "good".

Comparative Example 1

The same procedure was followed as in Example 1 to find the coverage rate and the moisture resistance test survival rate except for making the weight ratio of the metal species in the internal electrode layers finally obtained Au:Pt:Pd= 0:10:0 and making the firing temperature 1140° C. The results are shown in Table 1. As shown in Table 1, the coverage rate was 100 percent and the survival rate was 10 percent. Since the survival rate was less than 50 percent, the overall judgement was "poor". Further, the cross-section of the obtained sample was observed, whereupon delamination of the internal electrode layers and piezoelectric layers was observed.

Further, with an Au:Pt:Pd=0:10:0 electrode, it is necessary to optimize the additives in the electrode or the firing pattern etc., so manufacture is difficult. The reproducibility is poor and therefore this is unsuitable for mass production. Further, due to use of platinum, there are the demerits that the manufacturing costs rise and the firing temperature must also be made higher.

Comparative Example 2

The same procedure was followed as in Example 1 to find the coverage rate and the moisture resistance test survival rate except for making the weight ratio of the metal species in the internal electrode layers finally obtained Ag:Pd=7:3, making the thickness of the internal electrode layers 2 μm, and making the firing temperature 1060° C. The results are shown in Table 1. As shown in Table 1, the coverage rate was 70 percent and the survival rate was 0 percent. Since the survival rate was at least 50 percent, the overall judgement was "poor".

EXAMPLE 4

The same procedure was followed as in Example 1 to find the coverage rate and the moisture resistance test survival rate except for making the weight ratio of the metal species in the internal electrode layers finally obtained Au:Pt:Pd=7:3:0 and making the composition of the piezoelectric layers finally obtained a lead-based piezoelectric material comprised of 99.6 wt % of $(Pb_{0.95}Sr_{0.04})((Zn_{1/3}Nb_{2/3})_{0.1}Ti_{0.42}Zr_{0.48})O_3$ and 0.4 wt % of $Ta_2O_5$. The results are shown in Table 1. As shown in Table 1, the coverage rate was 70 percent and the survival rate was 100 percent. Since the survival rate was at least 90 percent, the overall judgement was "very good".

EXAMPLE 5

The same procedure was followed as in Example 4 to find the coverage rate and the moisture resistance test survival rate except for making the weight ratio of the metal species in the internal electrode layers finally obtained Au:Pt:Pd=7:1.5:1.5 and making the firing temperature 1100° C. The results are shown in Table 1. As shown in Table 1, the coverage rate was 85 percent and the survival rate was 100 percent. Since the survival rate was at least 90 percent, the overall judgement was "very good".

EXAMPLE 6

The same procedure was followed as in Example 4 to find the coverage rate and the moisture resistance test survival rate except for making the weight ratio of the metal species in the internal electrode layers finally obtained Au:Pt:Pd=7:0:3, making the thickness of the internal electrode layers 1.9 μm, and making the firing temperature 1100° C. The results are shown in Table 1. As shown in Table 1, the coverage rate was 90 percent and the survival rate was 100 percent. Since the survival rate was at least 90 percent, the overall judgement was "very good".

EXAMPLE 7

The same procedure was followed as in Example 4 to find the coverage rate and the moisture resistance test survival rate except for making the weight ratio of the metal species in the internal electrode layers finally obtained Au:Pt:Pd=3:7:0, making the thickness of the internal electrode layers 1.9 μm, and making the firing temperature 1100° C. The results are shown in Table 1. As shown in Table 1, the coverage rate was 80 percent and the survival rate was 80 percent. Since the survival rate was at least 60 percent, the overall judgement was "good".

EXAMPLE 8

The same procedure was followed as in Example 4 to find the coverage rate and the moisture resistance test survival rate except for making the weight ratio of the metal species in the internal electrode layers finally obtained Au:Pt:Pd=3:5:2, making the thickness of the internal electrode layers 2.0 μm, and making the firing temperature 1100° C. The results are shown in Table 1. As shown in Table 1, the coverage rate was 90 percent and the survival rate was 80 percent. Since the survival rate was at least 60 percent, the overall judgement was "good".

EXAMPLE 9

The same procedure was followed as in Example 4 to find the coverage rate and the moisture resistance test survival rate except for making the weight ratio of the metal species in the internal electrode layers finally obtained Au:Pt:Pd=3:4:3, making the thickness of the internal electrode layers 2.0 μm, and making the firing temperature 1100° C. The results are shown in Table 1. As shown in Table 1, the coverage rate was 90 percent and the survival rate was 80 percent. Since the survival rate was at least 60 percent, the overall judgement was "good".

EXAMPLE 10

The same procedure was followed as in Example 4 to find the coverage rate and the moisture resistance test survival rate except for making the weight ratio of the metal species in the internal electrode layers finally obtained Au:Pt:Pd=2:8:0 and making the firing temperature 1100° C. The results are shown in Table 1. As shown in Table 1, the coverage rate was 85 percent and the survival rate was 80 percent. Since the survival rate was at least 60 percent, the overall judgement was "good".

EXAMPLE 11

The same procedure was followed as in Example 4 to find the coverage rate and the moisture resistance test survival rate except for making the weight ratio of the metal species in the internal electrode layers finally obtained Au:Pt:Pd=2:7:1, making the thickness of the internal electrode layers 1.9 μm, and making the firing temperature 1100° C. The results are shown in Table 1. As shown in Table 1, the coverage rate was 85 percent and the survival rate was 80 percent. Since the survival rate was at least 60 percent, the overall judgement was "good".

EXAMPLE 12

The same procedure was followed as in Example 4 to find the coverage rate and the moisture resistance test survival rate except for making the weight ratio of the metal species in the internal electrode layers finally obtained Au:Pt:Pd=2:6:2 and making the firing temperature 1100° C. The results are shown in Table 1. As shown in Table 1, the coverage rate was 90 percent and the survival rate was 80 percent. Since the survival rate was at least 60 percent, the overall judgement was "good".

Comparative Example 3

The same procedure was followed as in Example 4 to find the coverage rate and the moisture resistance test survival rate except for making the weight ratio of the metal species in the internal electrode layers finally obtained Au:Pt:Pd= 0:10:0, making the thickness of the internal electrode layers 2.0 μm, and making the firing temperature 1100° C. The results are shown in Table 1. As shown in Table 1, the coverage rate was 100 percent and the survival rate was 20 percent. Since the survival rate was less than 50 percent, the overall judgement was "poor". Further, the cross-section of a sample obtained was observed, whereupon delamination of the internal electrode layers and piezoelectric layers was observed.

Comparative Example 4

The same procedure was followed as in Example 4 to find the coverage rate and the moisture resistance test survival rate except for making the weight ratio of the metal species in the internal electrode layers finally obtained Ag:Pd=7:3 and making the thickness of the internal electrode layers 2.0 μm. The results are shown in Table 1. As shown in Table 1, the coverage rate was 70 percent and the survival rate was 10 percent. Since the survival rate was less than 50 percent, the overall judgement was "poor".

Comparative Example 5

The same procedure was followed as in Example 4 to find the coverage rate and the moisture resistance test survival rate except for making the weight ratio of the metal species in the internal electrode layers finally obtained Ag:Pd=3:7 and making the thickness of the internal electrode layers 2.1 μm. The results are shown in Table 1. As shown in Table 1, the coverage rate was 80 percent and the survival rate was 10 percent. Since the survival rate was less than 50 percent, the overall judgement was "poor".

Reference Example 1

The same procedure was followed as in Example 4 to find the coverage rate and the moisture resistance test survival rate except for making the thickness of the internal electrode layers 0.8 μm. The results are shown in Table 1. As shown in Table 1, the coverage rate was 30 percent. Disconnection of the internal electrode layers was observed and the moisture resistance test was not possible. Therefore, the overall judgement was "poor". The disconnection of the internal electrode layers is believed to have been because the thickness of the internal electrode layers was less than 1 μm.

EXAMPLE 13

The same procedure was followed as in Example 4 to find the coverage rate and the moisture resistance test survival rate except for making the thickness of the internal electrode layers 1.3 μm. The results are shown in Table 1. As shown in Table 1, the coverage rate was 60 percent and the survival rate was 80 percent. Since the survival rate was at least 60 percent, the overall judgement was "good".

EXAMPLE 14

The same procedure was followed as in Example 4 to find the coverage rate and the moisture resistance test survival rate except for making the thickness of the internal electrode layers 2.8 μm. The results are shown in Table 1. As shown in Table 1, the coverage rate was 65 percent and the survival rate was 70 percent. Since the survival rate was at least 60 percent, the overall judgement was "good".

Reference Example 2

The same procedure was followed as in Example 4 to find the coverage rate and the moisture resistance test survival rate except for making the thickness of the internal electrode layers 3.5 μm. The results are shown in Table 1. As shown in Table 1, the coverage rate was 60 percent and the survival rate was 20 percent. Since the survival rate was less than 50 percent, the overall judgement was "poor". Further, a cross-section of a sample obtained was observed, whereupon delamination of the internal electrode layers and piezoelectric layers was observed. This is believed because the thickness of the internal electrode layers was larger than 3 μm.

Reference Example 3

The same procedure was followed as in Example 4 to find the coverage rate and the moisture resistance test survival rate except making the firing temperature 1180° C. The results are shown in Table 1. As shown in Table 1, the coverage rate was 40 percent and the survival rate was 30 percent. Since the survival rate was less than 50 percent, the overall judgement was "poor". It is believed the coverage rate fell to less than 50 percent since the firing temperature was too high.

EXAMPLE 15

The same procedure was followed as in Example 1 to find the coverage rate and the moisture resistance test survival rate except for making the weight ratio of the metal species in the internal electrode layers finally obtained Au:Pt:Pd= 3:7:0, making the composition of the piezoelectric layers finally obtained a lead-based piezoelectric material comprised of $(Pb_{0.94}Sr_{0.04})((Mg_{1/3}Nb_{2/3})_{0.265}Ti_{0.395}Zr_{0.335})O_3$, making thickness of the internal electrode layers 1.9 μm, and making the firing temperature 1180° C. The results are shown in Table 1. As shown in Table 1, the coverage rate was 80 percent and the survival rate was 70 percent. Since the survival rate was more than 60 percent, the overall judgement was "good".

EXAMPLE 16

The same procedure was followed as in Example 15 to find the coverage rate and the moisture resistance test survival rate except for making the weight ratio of the metal species in the internal electrode layers finally obtained Au:Pt:Pd=2:8:0 and making the thickness of the internal electrode layers 1.8 μm. The results are shown in Table 1. As shown in Table 1, the coverage rate was 85 percent and the survival rate was 70 percent. Since the survival rate was more than 60 percent, the overall judgement was "good".

EXAMPLE 17

The same procedure was followed as in Example 4 to find the coverage rate and the moisture resistance test survival rate except for making the weight ratio of the metal species in the internal electrode layers finally obtained Au:Pt:Pd=

8:2:0, making the thickness of the internal electrode layers 1.9 μm, and making the firing temperature 1020° C. The results are shown in Table 1. As shown in Table 1, the coverage rate was 60 percent and the survival rate was 80 percent. Since the survival rate was more than 60 percent, the overall judgement was "good".

As shown in Table 2, when Au:Pt:Pd=7:0:3, it was learned that when the firing temperature is 1060 to 1220° C., preferably 1060 to 1200° C., the moisture resistance is improved.

TABLE 2

| No. | Metal species | Ratio (wt %) | Thickness of electrode layer (μm) | Coverage rate (%) | Composition of material | Firing temperature (° C.) | Moisture resistance test survival rate (%) | Judgement | Remarks |
|---|---|---|---|---|---|---|---|---|---|
| Ref. Ex. 4 | Au:Pt:Pd | 7:0:3 | 2.0 | 95 | B | *1000 | 0 | Poor | Insuf. sinter |
| Ex. 19 | Au:Pt:Pd | 7:0:3 | 2.0 | 95 | B | 1060 | 100 | V. Good | |
| Ex. 6 | Au:Pt:Pd | 7:0:3 | 1.9 | 90 | B | 1100 | 100 | V. Good | |
| Ex. 20 | Au:Pt:Pd | 7:0:3 | 1.9 | 85 | B | 1140 | 100 | V. Good | |
| Ex. 21 | Au:Pt:Pd | 7:0:3 | 1.9 | 75 | B | 1180 | 100 | V. Good | |
| Ex. 22 | Au:Pt:Pd | 7:0:3 | 1.9 | 70 | B | 1200 | 90 | V. Good | |
| Ex. 23 | Au:Pt:Pd | 7:0:3 | 1.9 | 60 | B | 1220 | 70 | Good | |
| Ref. Ex. 5 | Au:Pt:Pd | 7:0:3 | 1.9 | *40 | B | *1240 | 0 | Poor | Discont. *1 |
| Ref. Ex. 6 | Au:Pt:Pd | 10:0:0* | 2.2 | 60 | B | *1000 | 0 | Poor | Insuf. sinter |
| Ref. Ex. 7 | Au:Pt:Pd | 10:0:0* | 2.1 | *40 | B | 1060 | 0 | Poor | Discont. *1 |
| Ref. Ex. 8 | Au:Pt:Pd | 9:0:1 | 2.3 | 95 | B | 1000 | 0 | Poor | Insuf. sinter |
| Ex. 24 | Au:Pt:Pd | 9:0:1 | 2.1 | 90 | B | 1020 | 90 | V. Good | |
| Ex. 25 | Au:Pt:Pd | 9:0:1 | 2.0 | 80 | B | 1060 | 100 | V. Good | |
| Ex. 26 | Au:Pt:Pd | 9:0:1 | 2.0 | 70 | B | 1100 | 70 | Good | |
| Ref. Ex. 9 | Au:Pt:Pd | 9:0:1 | 2.3 | 40 | B | 1140 | 30 | Poor | Discont. *1 |
| Ex. 27 | Au:Pt:Pd | 8:0:2 | 2.0 | 80 | B | 1100 | 100 | V. Good | |
| Ex. 28 | Au:Pt:Pd | 6:0:4 | 1.9 | 85 | B | 1100 | 90 | V. Good | |
| Ex. 29 | Au:Pt:Pd | 5:0:5 | 1.9 | 90 | B | 1100 | 70 | Good | |
| Ex. 30 | Au:Pt:Pd | 2:0:8 | 1.9 | 95 | B | 1140 | 60 | Good | |
| Comp. Ex. 8 | Au:Pt:Pd | 0:10:0* | 1.8 | 100 | B | 1180 | 0 | Poor | Delmanination |

Composition of materials
A: $(Pb_{0.957}Sr_{0.04})((Co_{1/3}Nb_{2/3})_{0.01}Ti_{0.458}Zr_{0.532})O_3$, $WO_3 = 0.6$ wt %
B: $(Pb_{0.95}Sr_{0.04})((Zn_{1/3}Nb_{2/3})_{0.1}Ti_{0.42}Zr_{0.48})O_3$, $Ta_2O_5 = 0.4$ wt %
C: $(Pb_{0.94}Sr_{0.04})((Mg_{1/3}Nb_{2/3})_{0.265}Ti_{0.395}Zr_{0.335})O_3$
*1: State where even initial capacity cannot be obtained since there is severe electrode discontinuation and electrodes are not connected.
*: Shows values outside preferable range of present invention.

EXAMPLE 18

The same procedure was followed as in Example 4 to find the coverage rate and the moisture resistance test survival rate except for making the weight ratio of the metal species in the internal electrode layers finally obtained Au:Rh=7:3, making the thickness of the internal electrode layers 2.0 μm, and making the firing temperature 1100° C. The results are shown in Table 1. As shown in Table 1, the coverage rate was 80 percent and the survival rate was 80 percent. Since the survival rate was more than 60 percent, the overall judgement was "good".

EXAMPLES 19 to 23 and Reference Examples 4 and 5

As shown in Table 2, the same procedure was followed as in Example 6 to find the coverage rate and the moisture resistance test survival rate except for making the thickness of the internal electrode layers 2.0 μm or 1.9 μm and changing the firing temperature between 1000° C. to 1240° C. The results are shown in Table 2.

Reference Examples 6 and 7

The same procedure was followed as in Example 6 to find the coverage rate and the moisture resistance test survival rate except for making the Au:Pt:Pd=10:0:0, making the thickness of the internal electrode layers 2.2 μm or 2.1 μm, and making the firing temperature 1000° C. or 1060° C. as shown in Table 2. The results are shown in Table 2.

As shown in Table 2, it was learned that when the metal ingredient in the internal electrode layers is 100 percent gold, the firing temperature has to be lowered, but insufficient sintering or disconnection of the electrodes occur and therefore the moisture resistance drops.

EXAMPLES 24 to 26 and Reference Examples 8 and 9

The same procedure was followed as in Example 6 to find the coverage rate and the moisture resistance test survival rate except for making the Au:Pt:Pd 9:0:1, making the thickness of the internal electrode layers 2.0 μm, 2.1 μm, or 2.3 μm and making the firing temperature 1000° C. to 1140° C. as shown in Table 2. The results are shown in Table 2.

As shown in Table 2, it was learned that when Au:Pt:Pd= 9:0:1, the moisture resistance is improved when the firing temperature is 1020 to 1100° C., preferably 1020 to 1060° C.

EXAMPLES 27 to 30 and Comparative Example 6

The same procedure was followed as in Example 6 to find the coverage rate and the moisture resistance test survival rate except for changing the Au:Pt:Pd ratio as shown in Table 2, making the thickness of the internal electrode layers 1.8 μm, 1.9 μm, or 2.0 μm, and making the firing temperature 1100° C., 1140° C., 1180° C. The results are shown in Table 2.

Notes

Compared with Comparative Examples 1 to 6, according to Examples 1 to 30, it was confirmed to be possible to realize a multilayer piezoelectric actuator device improved in the moisture resistance test survival rate, free from deterioration of the insulation resistance of the piezoelectric layers even under high humidity environments, superior in moisture resistance, and high in reliability.

Further, by comparing Reference Examples 1 and 2 and Examples 13 and 14, it was confirmed that when the thickness of the internal electrode layers is 1 to 3 μm, the effect of the present invention is improved.

Further, by comparing Comparative Example 3 and Reference Example 3 with Examples 4 to 14, it was confirmed that when the coverage rate is 50 to 99 percent, the effect of the present invention is improved.

Further, by comparing Reference Example 7 and Comparative Example 6 with Examples 26 to 30, it was confirmed that the content of the gold in the internal electrode layers is preferably 20 to 90 wt %, more preferably 60 to 90 wt %, particularly preferably 60 to 80 wt %, whereupon the moisture resistance was particularly improved.

Further, by referring to Examples 19 to 26, it was confirmed that the firing temperature was 1020 to 1220° C., more preferably 1060 to 1200° C.

As explained above, according to the present invention, it is possible to provide a multilayer piezoelectric device such as a multilayer piezoelectric actuator device which is free from deterioration of the insulation resistance of the piezoelectric layers even under a high humidity environment, is superior in moisture resistance, and is high in reliability.

What is claimed is:

1. A multilayer piezoelectric device comprising piezoelectric layers and internal electrode layers alternately stacked, said internal electrode layers containing gold as an essential ingredient, and the content of the gold in the internal electrode layers being 20 to 90 wt % with respect to the total weight of metal ingredients in the internal electrode layers as 100%.

2. The multilayer piezoelectric device as set forth in claim 1, wherein the content of the gold in the internal electrode layers is 60 to 90 wt % with respect to the total weight of metal ingredients in the internal electrode layers as 100%.

3. The multilayer piezoelectric device as set forth in claim 1, wherein the content of the gold in the internal electrode layers is 60 to 80 wt % with respect to the total weight of metal ingredients in the internal electrode layers as 100 wt %.

4. The multilayer piezoelectric device as set forth in claim 1, wherein said internal electrode layers contain at least one element from palladium, platinum, and rhodium.

5. The multilayer piezoelectric device as set forth in claim 1, wherein the internal electrode layers contain at least one element from palladium and platinum.

6. The multilayer piezoelectric device as set forth in claim 1, wherein the internal electrode layers contain palladium.

7. The multilayer piezoelectric device as set forth in claim 6, wherein the content of the palladium in the internal electrode layers is 20 to 40 wt % with respect to the total weight of metal ingredients in the internal electrode layers as 100 wt %.

8. The multilayer piezoelectric device as set forth in any claim 1, wherein the thickness of the internal electrode layers is 1 to 3 μm.

9. The multilayer piezoelectric device as set forth in claim 1, wherein the area of the piezoelectric layers which the internal electrode layers actually covers, that is, the coverage rate, is 50 to 99 percent.

10. The multilayer piezoelectric device as set forth in claim 1, wherein each piezoelectric layer comprises a lead-based piezoelectric material.

11. The multilayer piezoelectric device as set forth in claim 10, wherein the lead-based piezoelectric material contains a composition of the formula:

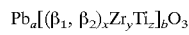

where $\beta_1$ is at least one element selected from Zn, Cd, Mg, Ni, Co, Fe, Sc, Cr, Yb, Lu, In, Mn, and Sn and $\beta_2$ is at least one element selected from Nb, Ta, W, Te, and Sb and x, y, z, a, and b are in relations of
$0 < x < 0.5$,
$0.1 \leq y \leq 0.55$,
$0.2 \leq z \leq 0.60$,
$x + y + z = 1$, and
$0.97 \leq a/b \leq 1$.

12. The multilayer piezoelectric device as set forth in claim 10, wherein the lead-based piezoelectric material contains a composition of the formula:

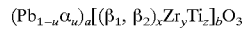

where $\alpha$ is at least one element selected from Sr, Ba, Ca, and La, $\beta_1$ is at least one element selected from Zn, Cd, Mg, Ni, Co, Fe, Sc, Cr, Yb, Lu, In, Mn, and Sn, and $\beta_2$ is at least one element selected from Nb, Ta, W, Te, and Sb and x, y, z, a, b, and u are in relations of
$0 < x < 0.5$,
$0.1 \leq y \leq 0.55$,
$0.2 \leq z \leq 0.60$,
$x + y + z = 1$,
$0.97 \leq a/b \leq 1$, and
$0 < u \leq 0.15$.

13. A method of producing a multilayer piezoelectric device comprised of piezoelectric layers and internal electrode layers alternately stacked, comprising the steps of:

including gold in said internal electrode layers as an essential ingredient, wherein the content of the gold in the internal electrode layers being 20 to 90 wt % with respect to the total weight of metal ingredients in the internal electrode layers as 100%, and firing the piezoelectric layers and internal electrode layers at a temperature of 1020 to 1220° C.

14. The method of producing a multilayer piezoelectric device as set forth in claim 13, comprising including gold so that the content of the gold in the internal electrode layers becomes 60 to 90 wt % with respect to the total weight of metal ingredients in the internal electrode layers as 100 wt %.

15. The method of producing a multilayer piezoelectric device as set forth in claim 13, comprising including gold so that the content of the gold in the internal electrode layers becomes 60 to 80 wt % with respect to the total weight of metal ingredients in the internal electrode layers as 100 wt %.

16. The method of producing a multilayer piezoelectric device as set forth in claim 13, further comprising including at least one element from palladium, platinum, and rhodium in said internal electrode layers.

17. The method of producing a multilayer piezoelectric device as set forth in claim 16, comprising including palladium so that the content of the palladium in the internal electrode layers becomes 20 to 40 wt % with respect to the total weight of metal ingredients in the internal electrode layers as 100 wt %.

* * * * *